(12) United States Patent
Lao et al.

(10) Patent No.: US 8,409,717 B2
(45) Date of Patent: Apr. 2, 2013

(54) COATED ARTICLE WITH IR REFLECTING LAYER AND METHOD OF MAKING SAME

(75) Inventors: Jingyu Lao, Saline, MI (US); Philip J. Lingle, Temperance, MI (US); Brent Boyce, Novi, MI (US); Bernd Disteldorf, Mettlach (DE); Richard Blacker, Farmington Hills, MI (US)

(73) Assignees: Guardian Industries Corp., Auburn Hills, MI (US); Centre Luxembourgeois de Recherches pour le Verre et la Ceramique S.A. (C.R.V.C.), Grand Duche de Luxembourg (LU)

( * ) Notice: Subject to any disclaimer, the term of this patent is extended or adjusted under 35 U.S.C. 154(b) by 1381 days.

(21) Appl. No.: 12/081,789

(22) Filed: Apr. 21, 2008

(65) Prior Publication Data

US 2009/0263596 A1   Oct. 22, 2009

(51) Int. Cl.
*B32B 17/06* (2006.01)
*B32B 15/04* (2006.01)

(52) U.S. Cl. ........ 428/432; 428/426; 428/433; 428/434; 428/688; 428/689; 428/699; 428/701; 428/702

(58) Field of Classification Search .................. 428/426, 428/432, 433, 434, 688, 689, 699, 701, 702
See application file for complete search history.

(56) References Cited

U.S. PATENT DOCUMENTS

| | | |
|---|---|---|
| 5,344,718 A | 9/1994 | Hartig et al. |
| 5,514,476 A | 5/1996 | Hartig et al. |
| 5,552,180 A | 9/1996 | Finley et al. |
| 5,770,321 A | 6/1998 | Hartig et al. |
| 5,800,933 A | 9/1998 | Hartig et al. |

(Continued)

FOREIGN PATENT DOCUMENTS

| | | |
|---|---|---|
| CA | 2 561 294 | 10/2005 |
| EP | 1 089 947 | 10/2003 |

(Continued)

OTHER PUBLICATIONS

U.S. Appl. No. 11/029,025, filed Jan. 5, 2005.

(Continued)

*Primary Examiner* — Jennifer McNeil
*Assistant Examiner* — Lauren Colgan
(74) *Attorney, Agent, or Firm* — Nixon & Vanderhye P.C.

(57) ABSTRACT

Example embodiments of this invention relate to a coated article including an infrared (IR) reflecting layer of a material such as silver or the like, for use in an insulating glass (IG) window unit for example. In certain example embodiments, the coating is a single-silver type coating, and includes an overcoat including an uppermost layer of or including silicon nitride and a layer of or including tin oxide immediately under and contacting the silicon nitride based overcoat. In certain example embodiments, the thicknesses of the silicon nitride based overcoat and the tin oxide based layer are balanced (e.g., substantially equal, or equal plus/minus about 10%). It has surprisingly been found that such balancing results in an improvement in thermal cycling performance and improved mechanical durability. In certain example embodiments, the coating may realize surprisingly good substantially neutral film side reflective coloration, and may achieve an improved visible transmission, SHGC ratio and low U-values. Moreover, in certain example embodiments, stress in the overcoat of the coating may be reduced by reducing nitrogen gas flow ($N_2$ ml/kW) and cathode power during a sputter-deposition process, thereby further improving thermal cycling performance.

9 Claims, 5 Drawing Sheets

U.S. PATENT DOCUMENTS

| | | | |
|---|---|---|---|
| 5,834,103 A | 11/1998 | Bond et al. | |
| 5,948,538 A | 9/1999 | Brochot et al. | |
| 5,962,115 A | 10/1999 | Zmelty et al. | |
| 6,045,896 A | 4/2000 | Boire et al. | |
| 6,287,675 B1 | 9/2001 | Guiselin et al. | |
| 6,322,881 B1 * | 11/2001 | Boire et al. | 428/216 |
| 6,398,925 B1 | 6/2002 | Arbab et al. | |
| 6,524,714 B1 | 2/2003 | Neuman et al. | |
| 6,541,084 B2 | 4/2003 | Wang | |
| 6,562,490 B2 | 5/2003 | Ebisawa et al. | |
| 6,572,940 B1 | 6/2003 | Noethe et al. | |
| 6,576,349 B2 | 6/2003 | Lingle et al. | |
| 6,582,809 B2 | 6/2003 | Boire et al. | |
| 6,589,658 B1 | 7/2003 | Stachowiak | |
| 6,596,135 B1 | 7/2003 | Mitsui | |
| 6,602,587 B2 | 8/2003 | Macquart et al. | |
| 6,632,491 B1 | 10/2003 | Thomsen et al. | |
| 6,667,121 B2 | 12/2003 | Wang | |
| 6,673,427 B2 | 1/2004 | Guiselin et al. | |
| 6,686,050 B2 | 2/2004 | Lingle et al. | |
| 6,692,831 B2 | 2/2004 | Stachowiak | |
| 6,723,211 B2 | 4/2004 | Lingle et al. | |
| 6,743,343 B2 | 6/2004 | Kida et al. | |
| 6,749,941 B2 | 6/2004 | Lingle | |
| 6,782,718 B2 | 8/2004 | Lingle et al. | |
| 6,787,005 B2 | 9/2004 | Laird et al. | |
| 6,800,182 B2 | 10/2004 | Mitsui et al. | |
| 6,802,943 B2 | 10/2004 | Stachowiak | |
| 2003/0150711 A1 | 8/2003 | Laird | |
| 2003/0194488 A1 | 10/2003 | Stachowiak | |
| 2003/0194567 A1 | 10/2003 | Lingle et al. | |
| 2003/0198816 A1 | 10/2003 | Lingle et al. | |
| 2004/0005467 A1 | 1/2004 | Neuman et al. | |
| 2004/0121165 A1 | 6/2004 | Laird | |
| 2004/0180214 A1 | 9/2004 | Laird et al. | |
| 2005/0025917 A1 | 2/2005 | Laird et al. | |
| 2005/0042459 A1 | 2/2005 | Kriltz et al. | |
| 2005/0042460 A1 | 2/2005 | Kriltz | |
| 2005/0196622 A1 * | 9/2005 | Laird et al. | 428/432 |
| 2006/0099428 A1 * | 5/2006 | Butz et al. | 428/432 |
| 2006/0275613 A1 | 12/2006 | Butz et al. | |
| 2008/0008829 A1 * | 1/2008 | Blacker et al. | 427/162 |

FOREIGN PATENT DOCUMENTS

JP 62-041740 2/1987

OTHER PUBLICATIONS

U.S. Appl. No. 11/037,452, filed Jan. 19, 2005.
U.S. Appl. No. 60/625,164, filed Nov. 5, 2004.
"Method and Multichamber Apparatus to Coat a Glass Substrate With a Multilayer SnO/ZnO/Ag/CrNOx" Valentino et al., EP1371745, Dec. 17, 2003.
US 4,960,645, Oct. 1990, Lingle et al. (withdrawn).

* cited by examiner

| Layer Stack design type IGU 3.0mm Clear / 12mm gap 90% Argon filled / 3mm Clear | Ex. 1 | Ex. 2 | Ex. 3 |
|---|---|---|---|
| T (IGU) | 75.0 | 76.8 | 76.3 |
| a*, Transmission | -1.2 | -1.5 | -1.1 |
| b*, Transmission | 1.0 | 1.0 | 0.6 |
| L*, Transmission | 89.4 | 90.2 | 90.0 |
|  |  |  |  |
| Route (IGU) | 13.6 | 13.3 | 13.6 |
| a*, Film Side | -3.1 | -2.8 | -3.2 |
| b*, Film Side | 0.9 | 0.9 | 0.4 |
| L*, Film Side | 43.6 | 43.2 | 43.7 |
|  |  |  |  |
| Rin (IGU) | 12.4 | 12.1 | 12.5 |
| a*, Glass Side | -4.4 | -3.6 | -4.3 |
| b*, Glass Side | 0.0 | -1.0 | -1.1 |
| L*, Glass Side | 41.8 | 41.3 | 41.9 |
|  |  |  |  |
| Thermal performance |  |  |  |
| Solar Heat Gain Coefficient #3 | 0.679 | 0.687 | 0.685 |
| Imperial U Value (Winter, emissivity, Rs) | 0.274 | 0.271 | 0.280 |
| Metric U- Value (Winter) | 1.558 | 1.541 | 1.592 |

Fig. 3

Impact of process settings on silicon nitride and SnO2 overcoat single layer stress and composition

| | Glass ID | Power (kw) | Ar flow rate sccm | N2 flow rate sccm | N2 ml/kw | n @550nm | k @550nm | stress - Average Mpa |
|---|---|---|---|---|---|---|---|---|
| | 4758 | 75 | 175 | 577 | 7.7 | 2.06 | 0.006 | 1525 |
| | 4759 | 67.5 | 400 | 641 | 9.5 | 2.057 | 0.008 | 969 |
| | 4757 | 67.5 | 400 | 577 | 8.5 | 2.064 | 0.005 | 897 |
| Silicon nitride overcoat single layer | 120 | 43 | 400 | 347 | 8.1 | 2.059 | 0.004 | 325 |
| | 118 | 39 | 400 | 273 | 7.0 | 2.346 | 0.055 | 214 |
| | 122 | 35 | 400 | 293 | 8.4 | 2.146 | 0.013 | 271 |
| | 121 | 28 | 400 | 238 | 8.5 | 2.195 | 0.019 | 200 |

| | Glass ID | Power | top Sn Ar flow rate | | | n @550nm | k @550nm | stress - Average (Mpa) |
|---|---|---|---|---|---|---|---|---|
| Top SNO2 single layer | 4764 | 59.2 | 150 | | | 2.019 | 0.003 | 403 |
| | 4765 | 51.2 | 250 | | | 2.021 | 0.003 | 279 |
| | 4763 | 44.5 | 400 | | | 2.011 | 0.003 | 179 |

Fig. 5

COATED ARTICLE WITH IR REFLECTING LAYER AND METHOD OF MAKING SAME

This application relates to a coated article including an infrared (IR) reflecting layer of a material such as silver or the like. In certain example embodiments, a layer comprising zinc oxide is provided under the IR reflecting layer in order to improve qualities thereof. In certain example embodiments, the coating is a single-silver type coating, and includes an overcoat including an uppermost layer of or including silicon nitride and a layer of or including tin oxide under the silicon nitride based layer. In certain example embodiments, the thicknesses of the silicon nitride based uppermost layer and the tin oxide based layer are balanced (e.g., substantially equal, or equal plus/minus about 10-15%). It has surprisingly been found that balancing the thicknesses of the silicon nitride based uppermost layer and the adjacent tin oxide based layer results in an overall coating that has significantly improved thermal cycling performance and improved mechanical durability. In certain example embodiments, the silicon nitride based uppermost layer and the tin oxide based layer of the overcoat each have a thickness of at least about 90 angstroms (Å), more preferably at least about 120 Å, and still more preferably at least about 150 Å. For example, the silicon nitride based uppermost layer and the tin oxide based layer may each be from about 160-180 Å thick in certain example embodiments, so as to improve thermal cycling performance and durability of the overall coating. In certain example embodiments, the coating also has surprisingly good substantially neutral film side reflective coloration, monolithically or more preferably in an insulating glass (IG) window unit.

In certain example embodiments, an IG window unit including the coating (e.g., on surface #3) has an SHGC value of no less than about 0.65, more preferably no less than about 0.68; and a visible transmission of at least about 68%, more preferably at least about 70%, 72%, or even at least about 74%. In certain example embodiments of this invention, the IG window unit can realize a combination of good visible transmission ($T_{vis}$) and an excellent solar heat gain coefficient (SHGC). In view of the above, it is possible to permit the coated article, such as an IG window unit for example, to realize improved properties such as one or more of a low U-value, and/or an Energy Rating (ER) of no less than 29. Additionally, in certain example embodiments, it has surprisingly been found that the stress of the overcoat can be unexpectedly reduced by reducing nitrogen gas flow ($N_2$ ml/kW) and cathode power during the sputter-deposition process of the overcoat. It has been found that low overcoat stress is a factor contributing to good thermal cycling results.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like. In certain example instances, designers of coated articles often strive for a combination of high visible transmission, substantially neutral color, low emissivity (or emittance), low sheet resistance ($R_s$), low U-values in the context of IG window units, and/or low specific resistivity. High visible transmission and substantially neutral color may permit coated articles to be used in applications where these characteristics are desired such as in architectural or vehicle window applications, whereas low-emissivity (low-E), low sheet resistance, and low specific resistivity characteristics permit such coated articles to block significant amounts of IR radiation so as to reduce for example undesirable heating of vehicle or building interiors.

However, conventional coated articles are lacking with respect to one or more of: (i) thermal cycling performance, (ii) mechanical durability, (iii) ability to achieve good substantially neutral film side reflective coloration monolithically or more preferably in an insulating glass (IG) window unit, (iv) ability to realize a combination of good visible transmission ($T_{vis}$) and an excellent solar heat gain coefficient (SHGC) and low U-values for increasing or maximizing solar heat gain and reducing or minimizing heat loss of building interiors, and/or (v) ability to meet an Energy Rating (ER) of no less than 29.

In view of the above, it will be appreciated that there exists a need in the art for a coated article including a coating (e.g., in the context of an IG window unit) which has the ability to realize one or more of: (i) improved thermal cycling performance, (ii) improved mechanical durability, (iii) substantially neutral film side reflective coloration monolithically and/or more preferably in an insulating glass (IG) window unit, (iv) high $T_{vis}$ and good SHGC, (v) low U-values, and/or (vi) an Energy Rating (ER) of no less than 29.

The Canadian Hydro-Quebec Energy Initiatives have asked for window product for residential applications with high solar heat gain, high visible light transmission, and good thermal insulation. In this respect, Zone C ER requires ER as high as 25, and Zone D requires ER no less than 29. Current conventional sputter-coated single Ag layer coatings in the market can meet some, but not all, requirements. In particular, they still need further energy rating improvement for residential applications in northern climates mainly due to not having a sufficiently high SHGC.

Certain example embodiments of this invention relate to a coated article including an infrared (IR) reflecting layer of a material such as silver or the like. In certain example embodiments, a layer comprising zinc oxide is provided under the IR reflecting layer in order to improve qualities thereof. In certain example embodiments, the coating is a single-silver type coating, and includes an overcoat including an uppermost layer of or including silicon nitride and a layer of or including tin oxide immediately under and contacting the silicon nitride based uppermost layer. In certain example embodiments, the thicknesses of the silicon nitride based uppermost layer and the tin oxide based layer of the overcoat are balanced (e.g., substantially equal, or equal plus/minus about 10%). It has surprisingly been found that balancing the thicknesses of the silicon nitride based layer and the adjacent tin oxide based layer results in a coating that has significantly improved thermal cycling performance and improved mechanical durability. In certain example embodiments, the silicon nitride based uppermost layer and the adjacent tin oxide based layer each have a thickness of at least about 90 angstroms (Å), more preferably at least about 120 Å, and still more preferably at least about 150 Å. For example, the silicon nitride based uppermost layer and the tin oxide based layer may each be from about 160-180 Å thick in certain example embodiments, so as to improve thermal cycling performance and durability of the coating. In certain example embodiments, the coating also has surprisingly good substantially neutral film side reflective coloration, monolithically or more preferably in an insulating glass (IG) window unit. In certain example embodiments, the thickness of the IR reflecting layer is adjusted to achieve a balance of low U-value and high SHGC for maximizing ER ratings.

In certain example embodiments, an IG window unit including the coating (e.g., on surface #3) has an SHGC value of no less than about 0.65, more preferably no less than about 0.68; and a visible transmission of at least about 68%, more preferably at least about 70%, 72%, or even at least about 74%. In certain example embodiments of this invention, the IG window unit can realize a combination of good visible transmission ($T_{vis}$) and an excellent solar heat gain coefficient (SHGC). For coatings according to example embodiments of this invention, a high SHGC is preferred because the coating is adapted for use in northern climates. The high SHGC desired for this coating is the opposite of low SHGC values desired for coatings for use in southern climates. In view of the above, it is possible to permit the coated article, such as an IG window unit for example, to realize improved properties such as one or more of a low U-value (e.g., U-value of no greater than about 0.33, 0.30 or 0.28), and/or an Energy Rating (ER) of no less than 25, more preferably no less than 29.

Additionally, in certain example embodiments, it has been found that the stress of the overcoat can be dramatically reduced by increasing inert gas flow rate (e.g., argon gas flow), and reducing nitrogen gas flow ($N_2$ ml/kW) and cathode power during the sputter-deposition process of the overcoat. It has been surprisingly found that low overcoat stress is a significant factor contributing to good thermal cycling results.

In certain example embodiments, a layer comprising an oxide of Ni and/or Cr is provided between the tin oxide based layer and the Ag based IR reflecting layer, and the layer comprising Ni and/or Cr may be substoichiometric in order to provide improved adhesion to the overlying tin oxide based layer so as to improve durability. Coated articles herein may be used in the context of insulating glass (IG) window units, or in other suitable applications such as monolithic window applications, laminated windows, and/or the like.

In certain example embodiments of this invention, there is provided a coated article including a coating supported by a glass substrate, the coating comprising: at least one dielectric layer; a layer comprising zinc oxide over the at least one dielectric layer; an infrared (IR) reflecting layer comprising silver on the glass substrate, located over and directly contacting the layer comprising zinc oxide, wherein the coating includes only one IR reflecting layer; a layer comprising an oxide of Ni and/or Cr located over and directly contacting the IR reflecting layer comprising silver; an overcoat comprising a layer comprising tin oxide located over the oxide of Ni and/or Cr and a layer comprising silicon nitride located over and contacting the layer comprising tin oxide; and wherein, in the overcoat, the layer comprising tin oxide and the layer comprising silicon nitride have substantially equal thicknesses plus/minus 15% in order to improve thermal cycling performance and mechanical durability of the coating.

In other example embodiments of this invention, there is provided a method comprising: sputter-depositing at least one dielectric layer and at least one IR reflecting layer over at least the dielectric layer; sputter-depositing an overcoat on the glass substrate over at least the IR reflecting layer, the overcoat comprising a layer comprising tin oxide and a layer comprising silicon nitride located over and contacting the layer comprising tin oxide; and when sputter-depositing the layer comprising silicon nitride using a nitrogen gas flow of no greater than 450 sccm, using a cathode power of less than 50 kW, and using a ratio of nitrogen gas flow to cathode power ($N_2$ ml/kW) of from about 6-10.

In yet another example embodiment of this invention, there is provided an IG window unit including a coating supported by a glass substrate, the coating from the glass substrate outwardly comprising: at least one dielectric layer; a layer comprising zinc oxide over the at least one dielectric layer; an infrared (IR) reflecting layer comprising silver on the glass substrate, located over and directly contacting the layer comprising zinc oxide, wherein the coating includes only one IR reflecting layer; a layer comprising an oxide of Ni and/or Cr located over and directly contacting the IR reflecting layer comprising silver; an overcoat comprising a layer comprising tin oxide located over the oxide of Ni and/or Cr and a layer comprising silicon nitride located over and contacting the layer comprising tin oxide; and wherein the IG unit has an SHGC value of at least 0.65, a visible transmission of at least 70%, and an Energy Rating of at least 25.

BRIEF DESCRIPTION OF THE DRAWINGS

FIG. 3 is a table illustrating optical and other characteristics of IG window units according to certain example embodiments of this invention.

FIG. 5 is a table illustrating the impact of process settings during sputter deposition of an overcoat, for stress purposes, according to certain example embodiments of this invention.

DETAILED DESCRIPTION OF EXAMPLE EMBODIMENTS OF THE INVENTION

Figure 1:
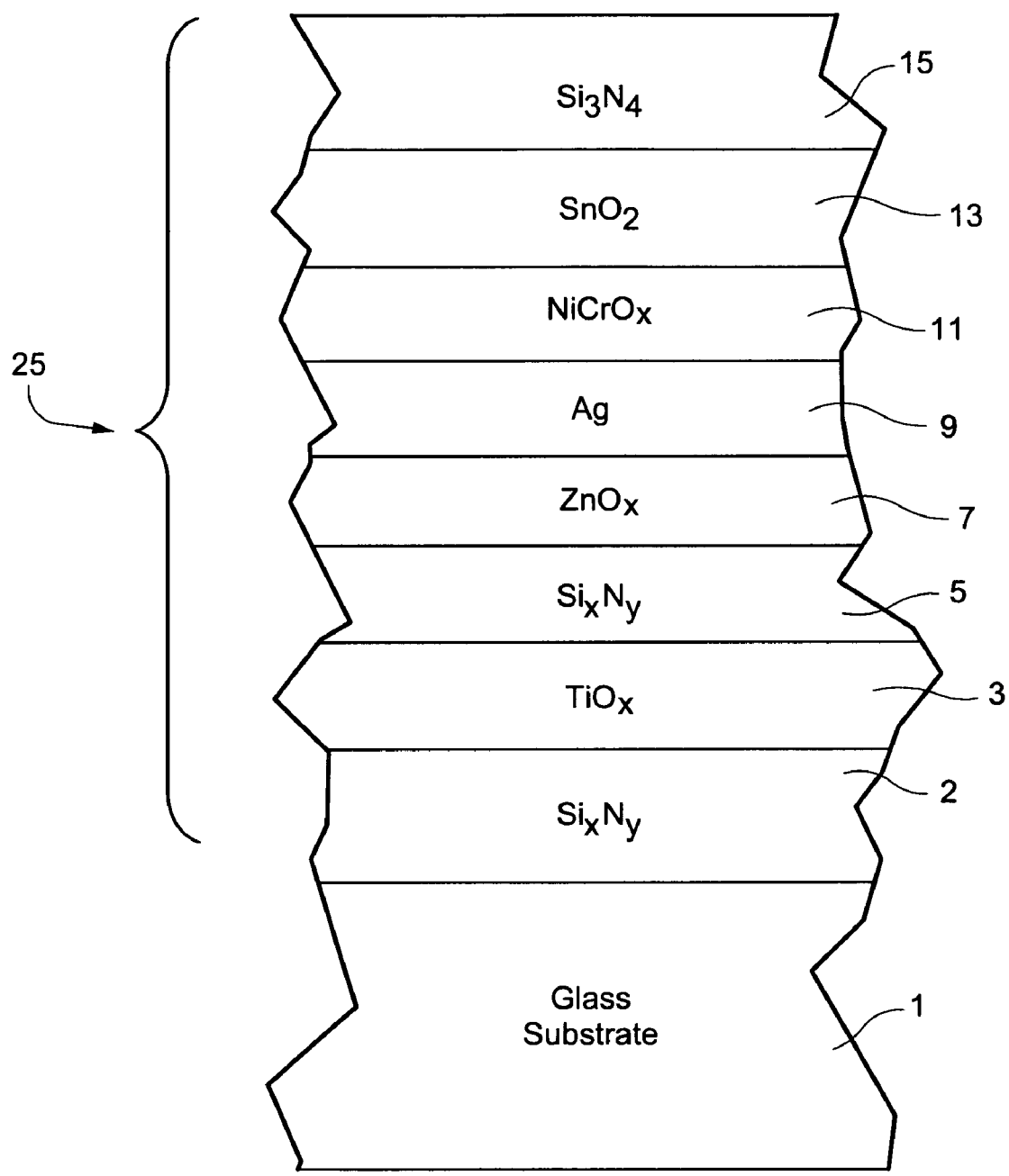
FIG. 1 is a cross sectional view of a coated article according to an example embodiment of this invention.

Referring now to the drawings in which like reference numerals indicate like parts throughout the several views.

Coated articles herein may be used in applications such as monolithic windows, IG window units such as residential windows, patio doors, vehicle windows, and/or any other suitable application that includes single or multiple substrates such as glass substrates. Certain example embodiments of this invention are particularly adapted for residential window and patio door applications where high heat gain and high visible light transmission is desired.

Generally speaking, certain example embodiments of this invention relate to a coated article including a coating 25 having an infrared (IR) reflecting layer 9 of a material such as silver, gold, or the like. In certain example embodiments, a layer comprising zinc oxide 7 is provided under the IR reflecting layer 9 in order to improve qualities of the Ag based layer 9. In certain example embodiments, the coating is a single-silver type coating (only one Ag based IR reflecting layer 9 is provided in the coating), and includes an overcoat (13, 15) including an uppermost layer 15 of or including silicon nitride and a layer of or including tin oxide 13 immediately under and contacting the silicon nitride based layer 15. The thicknesses (e.g., physical thicknesses) of the silicon nitride based layer 15 of the overcoat and the tin oxide based layer 13 of the overcoat are balanced (e.g., substantially equal, or equal plus/minus about 15% or 10%). It has surprisingly been found that balancing the thicknesses of the silicon nitride based layer 15 and the immediately adjacent tin oxide based layer 13 results in a coating 25 that has significantly improved thermal cycling performance and improved mechanical durability. In certain example embodiments, the silicon nitride based uppermost layer 15 and the tin oxide based layer 13 each have a thickness of at least about 90 angstroms (Å), more preferably at least about 120 Å, and still more preferably at least about 150 Å. For example, the silicon nitride based uppermost layer 15 and the adjacent tin oxide based layer 13 may each be from about 160-180 Å thick in certain example embodiments, so as to improve thermal cycling performance and durability of the coating. In certain example embodiments, the coating also has surprisingly good substantially neutral film side reflective coloration, monolithically or more preferably in an insulating glass (IG) window unit.

In certain example embodiments, an IG window unit (e.g., see FIG. 2) including the coating 25 (e.g., on surface #3) has an SHGC value of no less than about 0.65, more preferably no less than about 0.68; and a visible transmission of at least about 68%, more preferably at least about 70%, 72%, or even at least about 74%. In certain example embodiments of this invention, the IG window unit can realize a combination of good visible transmission ($T_{vis}$), excellent high solar heat gain coefficient (SHGC) and low U-value. For coatings according to example embodiments of this invention, a high SHGC is preferred because the coating is adapted for use in northern climates. The high SHGC desired for this coating is the opposite of low SHGC values desired for coatings for use in southern climates. In view of the above, it is possible to permit the coated article, such as an IG window unit for example, to realize improved properties such as one or more of a low U-value (e.g., U-value of no greater than about 0.33, 0.30 or 0.28), and/or an Energy Rating (ER) of no less than 29 (ER=57.76SHGC minus 21.90 U-value minus 0.54 ($L_{75}$/$A_W$)+40; where $L_{75}$ is the total airflow rate in m$^3$/h at a pressure difference of 75 Pa and $A_W$ is the area in m$^2$ as per the known reference sizes per the Energy Star Qualifying Criteria for Residential Windows, door and Skylights in Canada Version 2.0 Apr. 1, 05).

Additionally, in certain example embodiments, it has been found that the stress of the overcoat (13, 15) can be dramatically reduced by a combination of two or three of: (i) increasing argon (or other inert gas) flow rate, (ii) reducing nitrogen gas flow rate ($N_2$ ml/kW), and (iii) reducing cathode power, during the sputter-deposition process of at least the silicon nitride inclusive layer 15 of the overcoat. It has been surprisingly found that low overcoat stress is a factor contributing to good thermal cycling results.

An example thermal cycling test is pursuant to TP-603-3, the disclosure of which is incorporated herein by reference. For example, an Envirotronics Environmental Chamber, Model No. FLX900 may be used. Example settings for thermal cycling testing are as follows: thermal cycling, 11 hours at 23 degrees and 86% relative humidity, and 13 hours at −17 degrees C. and 0% relative humidity (one cycle per twenty four hours).

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) 25 provided on the substrate 1 either directly or indirectly. As shown in FIG. 1, the coating 25 is of or includes dielectric layer 2 of or including silicon nitride (e.g., $Si_3N_4$, or some other suitable stoichiometry), dielectric layer 3 of or including a metal oxide such as an oxide of titanium (e.g., $TiO_x$ where "x" is from 1 to 2, more preferably about 2), dielectric layer 5 of or including silicon nitride (e.g., $Si_3N_4$, or some other suitable stoichiometry), zinc oxide inclusive contact layer 7 (e.g., $ZnO_x$ where "x" may be about 1; or $ZnAlO_x$), IR (infrared) reflecting layer 9 including or of silver, gold, or the like, upper contact layer 11 of or including an oxide of Ni and/or Cr (e.g., $NiCrO_x$), and an overcoat of or including tin oxide inclusive dielectric layer 13 and silicon nitride inclusive dielectric layer 15. Of course, the silicon nitride inclusive layer 15 may further include Al, oxygen, or the like, and the tin oxide layer 13 may likewise further include other materials such as nitrogen, zinc, or the like. Other layers and/or materials may also be provided in the coating 25 in certain example embodiments of this invention, and it is also possible that certain layers may be removed or split in certain example instances. Moreover, one or more of the layers discussed above may be doped with other materials in certain example embodiments of this invention.

Figure 2:
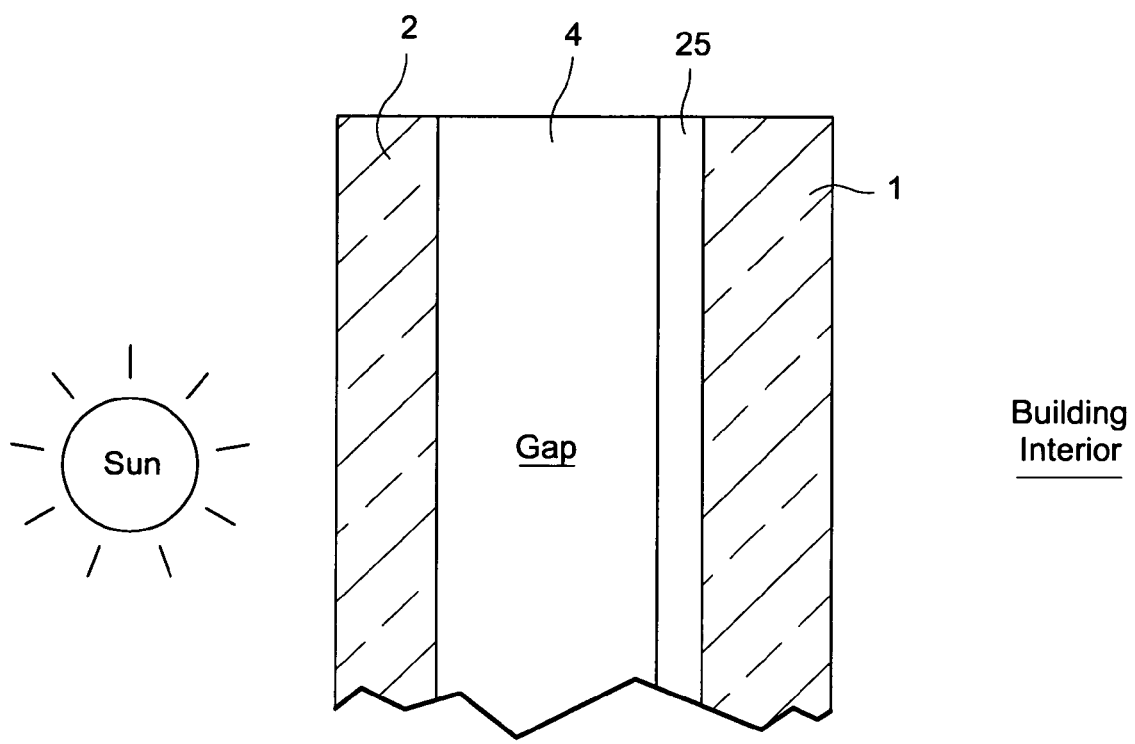
FIG. 2 is a cross sectional view of part of an insulating glass (IG) window unit including the coated article of FIG. 1 according to an example embodiment of this invention.

In monolithic instances, the coated article includes only one substrate such as glass substrate 1 (see FIG. 1). However, monolithic coated articles herein may be used in devices such as IG window units for example. Typically, as shown in FIG. 2, an IG window unit may include two spaced apart substrates 1 and 2, with an air gap 4 defined therebetween. Example IG window units are illustrated and described, for example, in U.S. Pat. Nos. 5,770,321, 5,800,933, 6,524,714, 6,541,084 and US 2003/0150711, the disclosures of which are all hereby incorporated herein by reference. An example IG window unit as shown in FIG. 2 may include, for example, the coated glass substrate 1 shown in FIG. 1 coupled to another glass substrate 2 via spacer(s), sealant(s) or the like with a gap 4 being defined therebetween. This gap 4 between the substrates in IG unit embodiments may in certain instances be filled with a gas such as argon (Ar). An example IG unit may comprise a pair of spaced apart substantially clear glass substrates each about 3-4 mm thick one of which is coated with a coating 25 herein in certain example instances, where the gap 4 between the substrates may be from about 5 to 30 mm, more preferably from about 10 to 20 mm, and most preferably about 12-16 mm. In certain example instances, the coating 25 may be provided on the side of the inner glass substrate 1 facing the gap, i.e., surface #3 (although the coating may be on the other substrate in certain alternative embodiments). In other example embodiments, the IG window unit may include additional glass sheets (e.g., the IG unit may include three spaced apart glass sheets instead of two).

Still referring to FIG. 2, in certain example IG unit embodiments of this invention, the coating 25 is designed such that the resulting IG unit (e.g., with, for reference purposes, a pair of 3-4 mm clear glass substrates spaced apart by 12-16 mm with Ar gas in the gap) has a U-value (imperial, winter, emissivity, Rs) of no greater than 0.31, more preferably no greater than 0.30, 0.29 or 0.28 Btu/h ft F. It is possible for the coating 25 to be provided on the interior surface of the other glass substrate 2 in alternative embodiments of this invention.

Silicon nitride inclusive dielectric layers 2 and 5 are provided for antireflection purposes, and have been found to allow color shifts to be reduced. One or both of the silicon nitride layers 2 and/or 5 may be $Si_3N_4$. Alternatively, one or both of the silicon nitride layers 2 and/or 5 may be of the Si-rich type (not fully stoichiometric). Moreover, one or both of the silicon nitride layers 2 and/or 5 may further include a dopant such as aluminum or stainless steel, and/or small amounts of oxygen. These layers may be deposited via sputtering in certain example embodiments, or via any other suitable technique.

Dielectric layer 3 may be of or include titanium oxide in certain example embodiments of this invention. The titanium oxide of layer 3 may in certain example instances be represented by $TiO_x$, where x is from 1.5 to 2.5, most preferably about 2.0. The titanium oxide may be deposited via sputtering or the like in different embodiments. In certain example instances, dielectric layer 3 may have an index of refraction (n), at 550 nm, of at least 2.0, more preferably of at least 2.1, and possibly from about 2.3 to 2.6 when the layer is of or includes titanium oxide. In certain embodiments of this invention, the thickness of titanium oxide inclusive layer 3 is controlled so as to allow a* and/or b* color values (e.g., transmissive, film side reflective, and/or glass side reflective) to be fairly neutral (i.e., close to zero) and/or desirable. Other materials may be used in addition to or instead of titanium oxide in certain example instances. In certain alternative embodiments, the Ti in oxide layer 3 may be replaced with another metal so that layer 3 may be of or include another metal oxide or dielectric including but not limited to tin oxide, zinc oxide, zinc aluminum oxide or silicon nitride.

Dielectric contact layer 7 is of or includes zinc oxide (e.g., ZnO). The zinc oxide of layer(s) 7 may contain other materials as well such as Al (e.g., to form $ZnAlO_x$) in certain example embodiments. For example, in certain example embodiments of this invention, zinc oxide layer 7 may be doped with from about 1 to 10% Al (or B), more preferably from about 1 to 5% Al (or B), and most preferably about 2 to 4% Al (or B). The use of zinc oxide 7 under the silver in layer 9 allows for an excellent quality of silver to be achieved. In certain example embodiments (e.g., to be discussed below) the zinc oxide inclusive layer 7 may be formed via sputtering a ceramic ZnO or metal rotatable magnetron sputtering target. It has been found that the use of the ceramic target in certain example embodiments (e.g., of ZnO, which may or may not be doped with Al, F or the like) allows for a high quality of silver to be provided thereby resulting in a lower emissivity coating. While the Zn:O in the ceramic target may be stoichiometric in certain example embodiments, at least one substoichiometric ceramic target comprising $ZnO_x$ (e.g., where $0.25 \leq x \leq 0.99$, more preferably $0.50 \leq x \leq 0.97$, and even more preferably $0.70 \leq x \leq 0.96$) may instead be used in sputter-depositing a zinc oxide inclusive layer 7 which may be substoichiometric in certain instances.

Infrared (IR) reflecting layer 9 is preferably substantially or entirely metallic and/or conductive, and may comprise or consist essentially of silver (Ag), gold, or any other suitable IR reflecting material. IR reflecting layer 9 helps allow the coating to have low-E and/or good solar control characteristics such as low emittance, low sheet resistance, and so forth. The IR reflecting layer may, however, be slightly oxidized in certain embodiments of this invention.

The silver based layer 9 is not very thick in certain example embodiments of this invention. The rather thin nature of the silver based layer 9 leads to bad durability characteristics. This is compensated for according to certain example embodiments of this invention by balancing the two layers 13 and 15 of the overcoat as discussed herein. Thus, the silver based IR reflecting layer 9 may be thinned, without sacrificing durability of the coating.

The upper contact layer 11 may be of or include an oxide of Ni and/or Cr. In certain example embodiments, upper contact layer 11 may be of or include nickel (Ni) oxide, chromium/chrome (Cr) oxide, or a nickel alloy oxide such as nickel chrome oxide ($NiCrO_x$), or other suitable material(s). The use of, for example, $NiCrO_x$ in this layer(s) 11 allows durability to be improved. The $NiCrO_x$ layer(s) 11, 11 may be fully oxidized in certain embodiments of this invention (i.e., fully stoichiometric), or alternatively may only be partially oxidized—substoichiometric (before and/or after optional HT). In certain instances, the $NiCrO_x$ layer 11 may be at least about 50% oxidized. Contact layer 11 (e.g., of or including an oxide of Ni and/or Cr) may or may not be oxidation graded in different embodiments of this invention. Oxidation grading means that the degree of oxidation in the layer changes through the thickness of the layer so that for example a contact layer may be graded so as to be less oxidized at the contact interface with the immediately adjacent IR reflecting layer 9 than at a portion of the contact layer further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layer 11 (e.g., of or including an oxide of Ni and/or Cr) may or may not be continuous in different embodiments of this invention across the entire IR reflecting layer 9.

It have been found that using a layer comprising an oxide of Ni and/or Cr 11 that is substoichiometric (metal rich) provides improved adhesion to the overlying tin oxide based layer 13 so as to improve durability of the overall coating. Thus, the use of a substoichiometric layer comprising an oxide of Ni and/or Cr for upper contact layer 11 is advantageous in this respect.

The overcoat is of or includes dielectric layers 13 and 15 in certain example embodiments. Dielectric layer 13 may be of or include a metal oxide such as tin oxide in certain example embodiments of this invention. Metal oxide inclusive layer 13 is provided for antireflection purposes, and also improves the emissivity of the coated article and the stability and efficiency of the manufacturing process. The tin oxide layer 13 may be doped with other materials such as nitrogen and/or zinc in certain example embodiments of this invention. The tin oxide based layer 13 provides good durability and improves light transmission. Dielectric layer 15 may be of or include silicon nitride (e.g., $Si_3N_4$ or other suitable stoichiometry) or any other suitable material in certain example embodiments of this invention such as silicon oxynitride. Silicon nitride layer 15 may further include other material, such as aluminum as a dopant or small amounts of oxygen in certain example embodiments of this invention. Optionally, other layers may be provided above layer 15 in the overcoat in certain example instances. Layer 15 is provided for durability purposes, and to protect the underlying layers. In certain example embodiments, silicon nitride based layer 15 may have an index of refraction (n) of from about 1.9 to 2.2, more preferably from about 1.95 to 2.05. In certain example embodiments, Zr may be provided in the silicon nitride of layer 15 (or layer 2 or layer 5). Thus, one or more of layers 2, 5 and/or 15 may be of or include SiZrNx and/or zirconium oxide in certain example embodiments of this invention.

Other layer(s) below or above the illustrated coating 25 may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention. For example and without limitation, silicon nitride layer 5 may be removed and layer 3 may be of tin oxide (e.g., $SnO_2$) instead of titanium oxide in certain alternative embodiments of this invention. As another example, silicon nitride layer 2 may be removed and layer 5 may be of tin oxide (e.g., $SnO_2$) instead of silicon nitride in certain alternative embodiments of this invention. As yet another example, layer 5 may be of tin oxide (e.g., $SnO_2$) instead of silicon nitride in still further alternative embodiments of this invention.

While various thicknesses may be used in different embodiments of this invention, example thicknesses and materials for the respective layers on the glass substrate 1 in the FIG. 1 embodiment are as follows, from the glass substrate outwardly (e.g., the Al content in the zinc oxide layer and the silicon nitride layers may be from about 1-10%, more preferably from about 1-3% in certain example instances):

TABLE 1

(Example Materials/Thicknesses; FIG. 1 Embodiment)

| Layer | Preferred Range (Å) | More Preferred (Å) | Example (Å) |
|---|---|---|---|
| $Si_xN_y$ (layer 2) | 20-300 Å | 60-160 Å | 135 Å |
| $TiO_x$ (layer 3) | 30-200 Å | 40-120 Å | 95 Å |
| $Si_xN_y$ (layer 5) | 20-300 Å | 40-140 Å | 65 Å |
| $ZnAlO_x$ (layer 7) | 10-200 Å | 40-120 Å | 90 Å |
| Ag (layer 9) | 40-120 Å | 65-95 Å | 85 Å |
| $NiCrO_x$ (layer 11) | 10-70 Å | 20-50 Å | 30 Å |
| $SnO_2$ (layer 13) | 80-210 Å | 160-180 Å | 170 Å |
| $Si_xN_y$ (layer 15) | 100-250 Å | 160-180 Å | 170 Å |

In certain example embodiments of this invention, coated articles herein (e.g., see FIG. 1) may have the following low-E (low emissivity), solar and/or optical characteristics set forth in Table 2 when measured monolithically, absent any heat treatment (thermal tempering).

TABLE 2

Low-E/Solar Characteristics (Monolithic; non-HT)

| Characteristic | General | More Preferred | Most Preferred |
|---|---|---|---|
| $R_s$ (ohms/sq.): | <=11.0 | <=10 | <=9 |
| $E_n$: | <=0.2 | <=0.15 | <=0.11 |
| $T_{vis}$ (%): | >=70 | >=80 | >=85 |

Moreover, IG window units having coated articles according to certain example embodiments of this invention have the following optical characteristics (e.g., where the coating 25 of FIG. 1 is used in the IG unit of FIG. 2) (e.g., for purposes of reference, when the coating is provided on a clear soda lime silica glass substrate 1 from 1 to 10 mm thick, preferably about 3-4 mm thick) on surface #3 of an IG window unit absent any HT of the coating. The good film side (or "outside") reflective color values (fairly neutral) are noted.

TABLE 3

Example Optical Characteristics (IG Unit)

| Characteristic | General | More Preferred |
|---|---|---|
| $T_{vis}$ (or TY)(Ill. C, 2 deg.): | >=70% | >=74.5% |
| $a^*_t$ (Ill. C, 2°): | -3.0 to +1.0 | -2.0 to 0.0 |
| $b^*_t$ (Ill. C, 2°): | -1.0 to +4.0 | 0.0 to +2.0 |
| $R_{outside}Y$ (Ill. C, 2 deg.): | <=18% | <=14% |
| $a^*_{out}$ (Ill. C, 2°): | -5.0 to +1.0 | -4 to 0.0 |
| $b^*_{out}$ (Ill. C, 2°): | -2.0 to +4.0 | -1.0 to +2.5 |
| $R_{inside}Y$ (Ill. C, 2 deg.): | <=15% | <=13% |
| $a^*_{inside}$ (Ill. C, 2°): | -7.0 to +4.0 | -5.5 to +2.0 |
| $b^*_{inside}$ (Ill. C, 2°): | -5.0 to +5.0 | -3.0 to +0.5 |
| SHGC: | >=.65 | >=.68 |
| Energy Rating (ER): | >=25 | >=29 |
| U-value (Btu/h ft F): | <=0.33 | <=0.30 or 0.28 |

EXAMPLES

The following example is provided for purposes of example only, and is not intended to be limiting. The following Example 1 was made via sputtering so as to have approximately the layer stack set forth below, from the clear glass substrate outwardly. The listed thicknesses are approximations:

TABLE 4

Layer Stack for Example 1

| Layer | Thickness (angstroms) |
|---|---|
| Glass Substrate | 3 mm |
| $Si_3N_4$ | 135 Å |
| $TiO_x$ | 95 Å |
| $Si_3N_4$ | 65 Å |
| $ZnAlO_x$ | 90 Å |
| Ag | 85 Å |
| $NiCrO_x$ | 30 Å |
| $SnO_2$ | 170 Å |
| $Si_3N_4$ | 170 Å |

The two layers 13 and 15 of the overcoat were sputter-deposited to the same thickness. After being sputter deposited onto the glass substrate, the coated article of Example 1 (see also FIG. 1) was provided in an IG window unit as shown in FIG. 2 so that the coating 25 was on surface #3 of the IG unit. The characteristics of Example 1 are shown in FIG. 3.

Example 2 was the same as Example 1, except that layer 5 was not present in Example 2, silicon nitride layer 2 was 140 angstroms thick, and layer 3 was made of tin oxide instead of titanium oxide and was about 170 angstroms thick. The characteristics of Example 2 are also shown in FIG. 3.

Example 3 was the same as Example 1, except that silicon nitride layer 2 was about 135 angstroms thick, titanium oxide layer 3 was about 45 angstroms thick, and layer 5 was made of tin oxide instead of silicon nitride and was about 100 angstroms thick. The characteristics of Example 3 are also shown in FIG. 3.

Figure 4:
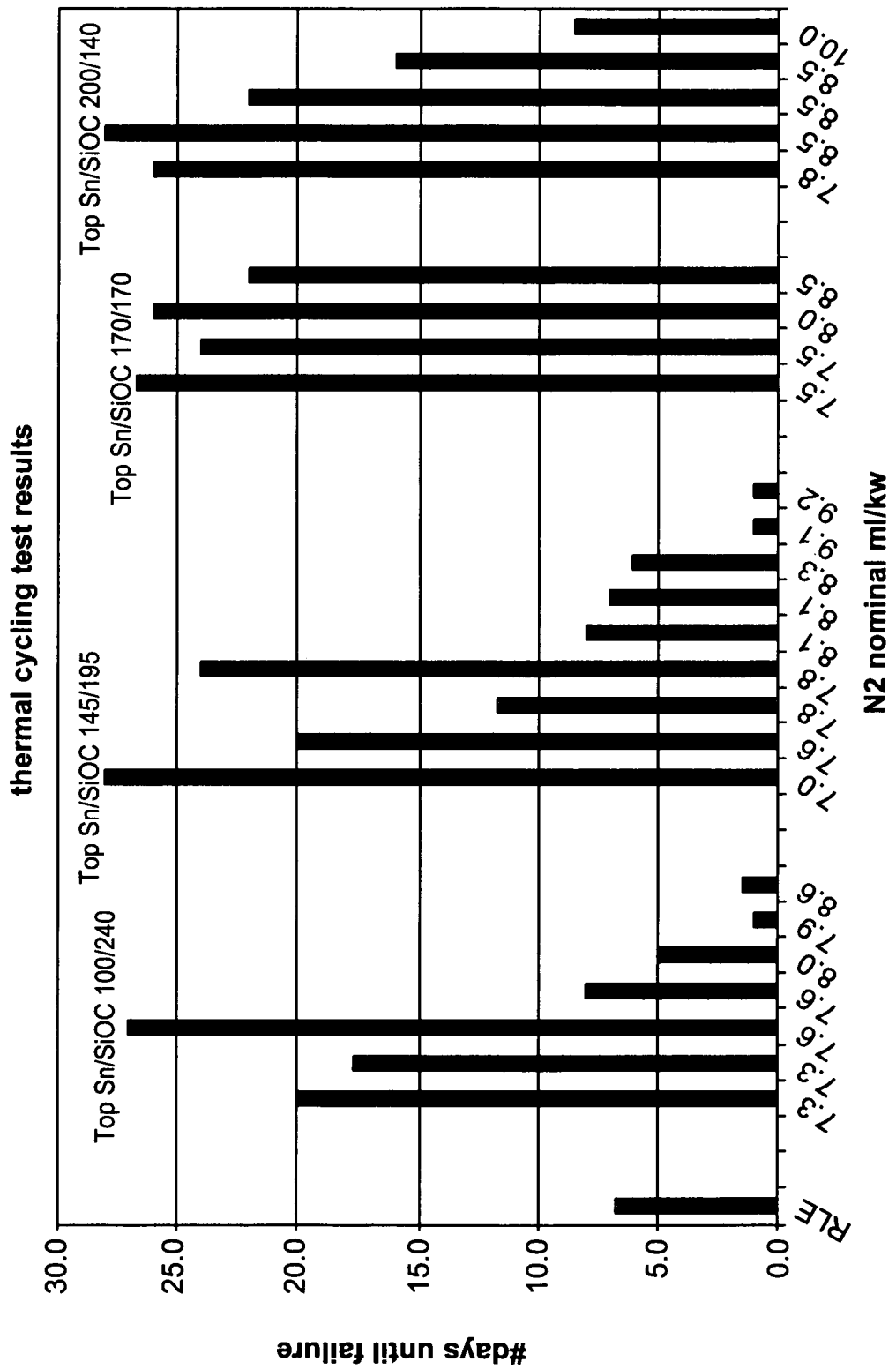
FIG. 4 is a graph plotting the number of days until failure as a function of nitrogen gas flow ml/kW during sputter deposition of the overcoat according to certain example embodiments of this invention.

Referring to FIG. 4, it has been found that balancing the thicknesses of the silicon nitride based layer 15 and the immediately adjacent tin oxide based layer 13 results in a coating 25 that has significantly improved thermal cycling performance and improved mechanical durability. In FIG. 4, "Top Sn/SiOC" refers to the overcoat (OC) of tin oxide 13 and silicon nitride 15, and the numbers such as 100, 240, 145, 195 and 170 in FIG. 4 refer to thicknesses of the corresponding layers of the overcoat in angstroms. FIG. 4 illustrates that the number of days until failure of a thermal cycling test is increased when the thicknesses of the layers 13 and 15 are balanced (substantially equal to each other). In certain instances, good results may also be achieved when the tin oxide based layer 13 is from about 0-25% thicker than the silicon nitride based layer 15, more preferably from about 1-20% or 1-15% thicker. The thicknesses (e.g., physical thicknesses) of the silicon nitride based layer 15 of the overcoat and the tin oxide based layer 13 of the overcoat are balanced (e.g., substantially equal, or equal plus/minus about 15% or 10%) in certain example embodiments. In certain example embodiments, the silicon nitride based uppermost layer 15 and the tin oxide based layer 13 each have a thickness of at least about 90 angstroms (Å), more preferably at least about 120 Å, and still more preferably at least about 150 Å. For example, the silicon nitride based uppermost layer 15 and the adjacent tin oxide based layer 13 may each be from about 160-210 or 160-180 Å thick in certain example embodiments, so as to improve thermal cycling performance and durability of the coating. In certain example embodiments, the average stress of the silicon nitride based layer 15 is less than about 400 MPa, more preferably less than about 300 MPa. In certain example embodiments, the average stress of the tin oxide based layer 13 is less than about 350 MPa, more preferably less than about 300 or 250 MPa.

FIG. 5 is a table illustrating that the design of the overcoat (layers 13, 15) are adjusted/provided in order to achieve good thermal cycling test results. It is believed that good thermal cycling performance is useful for the coating to endure outdoor temperature and humidity swings, especially in northern climates. In particular, in certain example embodiments, it has been found that the stress of the overcoat (13, 15) can be dramatically reduced by reducing nitrogen gas flow and cathode power ($N_2$ ml/kW) during the sputter-deposition process of at least the silicon nitride inclusive layer 15 of the overcoat. It has been surprisingly found that low overcoat stress (average MPa) is a significant factor contributing to good thermal cycling results. It can be seen from FIG. 4 that the stress of the silicon nitride based layer 15 can be reduced by providing (i) a ratio of nitrogen gas flow to cathode power ($N_2$ ml/kW) of from about 6-10, more preferably from about 7-9, in combination with (ii) the use of cathode power during sputtering of less than 50, more preferably less than 45, even more preferably less than 40, and most preferably less than about 35 or even 30 kW, and (iii) nitrogen gas flow rate (sccm) of no greater than about 450, 400, 350 or 300 sccm. When this nitrogen gas flow to cathode power ratio ($N_2$ ml/kW) is used, it can be seen in FIG. 5 that stress in the layer 15 becomes smaller as the cathode/target power (kW) becomes smaller along with the nitrogen gas flow rate. This is advantageous because low stress in the overcoat improve thermal cycling performance of the coating. However, the coating 25 formed by sputter-depositing using reduced nitrogen gas flow and reduced cathode power ($N_2$ ml/kW) during at least the formation of the silicon nitride based layer 15 may have deteriorated mechanical durability. It has been surprisingly found that with a preferred thickness range of overcoat design (13, 15), the overall coating 25 can have both good thermal cycling performance and mechanical durability. This is a surprising and unexpected result.

In a similar manner, FIG. 5 also illustrates that stress in the tin oxide based layer 13 can be reduced by reducing the cathode/target power used during sputter-depositing that layer. In certain example embodiments, the stress in layer 13 is reduced when the cathode power used to sputter-depositing the tin oxide based layer 13 is no more than 55, more preferably no more than 53 sccm.

It has also been found that increasing argon gas flow during sputtering of the silicon nitride based layer 15 and/or the tin oxide based layer 13 can be helpful in improving durability. For example, the silicon nitride based layer 15 is sputter-deposited using an argon gas flow of at least about 300 sccm, more preferably at least about 350 sccm, and most preferably at least about 375 sccm.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a coating supported by a glass substrate, the coating comprising:
    at least one dielectric layer;
    a layer comprising zinc oxide over the at least one dielectric layer;
    an infrared (IR) reflecting layer comprising silver on the glass substrate, located over and directly contacting the layer comprising zinc oxide, wherein the coating includes only one IR reflecting layer;
    a layer comprising an oxide of Ni and/or Cr located over and directly contacting the IR reflecting layer comprising silver;
    an overcoat comprising a layer comprising tin oxide located over the oxide of Ni and/or Cr and a layer comprising silicon nitride located over and contacting the layer comprising tin oxide;
    wherein, in the overcoat, the layer comprising tin oxide and the layer comprising silicon nitride have substantially equal thicknesses plus/minus 10% in order to improve thermal cycling performance and mechanical durability of the coating and the layer comprising tin oxide and the layer comprising silicon nitride each have a thickness of from about 160-180 Å.

2. The coated article of claim 1, wherein the at least one dielectric layer comprises a first layer comprising silicon nitride contacting the glass substrate, a layer comprising titanium oxide over and contacting the first layer comprising silicon nitride, and a second layer comprising silicon nitride over and contacting the layer comprising titanium oxide, and wherein the layer comprising zinc oxide directly contacts the second layer comprising silicon nitride.

3. The coated article of claim 1, wherein the coating has a sheet resistance ($R_s$) of no greater than 11 ohms/square.

4. The coated article of claim 1, wherein the coating has a sheet resistance ($R_s$) of no greater than 10 ohms/square.

5. The coated article of claim 1, wherein the coated article is an insulating glass (IG) window unit.

6. The coated article of claim 5, wherein the IG unit has an SHGC value of at least 0.68, a visible transmission of at least 74.5%, and an Energy Rating of at least 29.

7. The coated article of claim 5, wherein the IG unit has an SHGC value of at least 0.65, a visible transmission of at least 70%, and an Energy Rating of at least 25.

8. The coated article of claim 7, wherein the IG unit has a U-value of no greater than 0.30 Btu/h ft F.

9. The coated article of claim 7, wherein the IG unit comprises at least an interior glass substrate and an exterior glass substrate, wherein the coating is provided on a surface of the interior glass substrate facing a gap between the interior and exterior glass substrates, and wherein the IG unit has, as viewed from an exterior of a building in which the IG unit is provided, a reflective a* value of from about −4 to 0, and a reflective b* value of from about −1 to +2.5.

* * * * *